US012295125B1

(12) United States Patent
Li et al.

(10) Patent No.: US 12,295,125 B1
(45) Date of Patent: May 6, 2025

(54) EFFICIENT THERMAL CONTROL SYSTEM FOR MICROCIRCUIT BASED ON LIQUID METAL COOLANT

(71) Applicant: Guangdong Ocean University, Zhanjiang (CN)

(72) Inventors: Haowei Li, Zhanjiang (CN); Qing Xu, Zhanjiang (CN); Weijun Feng, Zhanjiang (CN); Jianyao Chen, Zhanjiang (CN); Yuanxing Mao, Zhanjiang (CN); Caisheng Li, Zhanjiang (CN); Jiakun Liu, Zhanjiang (CN)

(73) Assignee: Guangdong Ocean University, Zhanjiang (CN)

( * ) Notice: Subject to any disclaimer, the term of this patent is extended or adjusted under 35 U.S.C. 154(b) by 0 days.

(21) Appl. No.: 19/022,096

(22) Filed: Jan. 15, 2025

Related U.S. Application Data

(63) Continuation of application No. PCT/CN2024/136302, filed on Dec. 3, 2024.

(30) Foreign Application Priority Data

Jan. 12, 2024 (CN) .......................... 202410044864.7

(51) Int. Cl.
*H05K 7/20* (2006.01)
*F28F 27/02* (2006.01)

(52) U.S. Cl.
CPC ......... *H05K 7/20772* (2013.01); *F28F 27/02* (2013.01); *H05K 7/20836* (2013.01); *H05K 7/20327* (2013.01)

(58) Field of Classification Search
CPC ........... H05K 7/20254; H05K 7/20327; H05K 7/20536–20836; G06F 1/20
See application file for complete search history.

(56) References Cited

U.S. PATENT DOCUMENTS 7,340,904 B2 * 3/2008 Sauciuc .................. F28D 15/00
257/E23.098
8,017,872 B2 * 9/2011 Cripe ................. H05K 7/20254
361/720

(Continued)

FOREIGN PATENT DOCUMENTS

CN 109731624 A 5/2019
CN 110299336 A 10/2019

(Continued)

OTHER PUBLICATIONS

Zheng Xiaodong, Study on Efficient Heat Transfer in the Microchannels Based on Liquid Metal, Chinese Master's Theses Full-text Database (CMFD) Information technology series, Mar. 15, 2017, pp. 609, No. 3, pp. I-XIV, 1-59 Claims involved: 1-7.

(Continued)

*Primary Examiner* — Zachary Pape
(74) *Attorney, Agent, or Firm* — Piloff Passino & Cosenza LLP; Rachel K. Piloff; Sean A. Passino

(57) ABSTRACT

An efficient thermal control system for microcircuits based on liquid metal coolant is provided, including a cooling water system, a liquid metal supply system and a cooling system. The liquid metal supply system is used for supplying liquid metal to the cooling system to achieve heat exchange with a chip through the liquid metal, and the cooling water system is used for cooling the liquid metal. The cooling system includes a cooling capacity distribution unit used for distributing the liquid metal; cabinets provided with chip cooling platforms, which are connected to the cooling capacity distribution unit through a pipe, and are provided with the chip; a temperature measuring component used for measuring temperature of the chips; and a control unit, and cooling capacity distribution unit and the temperature mea- (Continued)

suring component are electrically connected to the control unit.

7 Claims, 6 Drawing Sheets

(56) References Cited

U.S. PATENT DOCUMENTS

| | | | | |
|---|---|---|---|---|
| 8,174,830 | B2* | 5/2012 | Lower | H05K 1/0272 |
| | | | | 174/15.1 |
| 2005/0099775 | A1* | 5/2005 | Pokharna | H01L 23/473 |
| | | | | 257/E23.098 |
| 2010/0067193 | A1* | 3/2010 | Arimilli | H05K 7/20745 |
| | | | | 165/80.2 |
| 2015/0116941 | A1* | 4/2015 | Chainer | F28D 15/02 |
| | | | | 361/699 |

FOREIGN PATENT DOCUMENTS

| | | |
|---|---|---|
| CN | 111998707 Y | 11/2020 |
| CN | 113437031 A | 9/2021 |

OTHER PUBLICATIONS

Retrieval report—First search dated Feb. 18, 2024 in SIPO application No. 202410044864.7.
Notice of Second Office action dated Mar. 16, 2024 in SIPO application No. 202410044864.7.
Notification to Grant Patent Right for Invention dated Oct. 31, 2024 in SIPO application No. 202410044864.7.
Retrieval report—Supplementary search dated Oct. 22, 2024 in SIPO application No. 2024100448647.

* cited by examiner

EFFICIENT THERMAL CONTROL SYSTEM FOR MICROCIRCUIT BASED ON LIQUID METAL COOLANT

CROSS-REFERENCE TO RELATED APPLICATIONS

This application is a continuation of PCT/CN2024/136302, filed Dec. 3, 2024 and claims priority of Chinese Patent Application No. 202410044864.7, filed on Jan. 12, 2024, the entire contents of which are incorporated herein by reference.

TECHNICAL FIELD

The present disclosure relates to chip heat dissipation, and in particular relates to an efficient thermal control system for a microcircuit based on liquid metal coolant.

BACKGROUND

With the development of data centers and supercomputer technology, the increase in server performance has brought about an increase in heat flow density. At present, air cooling and liquid cooling are two widely applied heat-dissipation solutions for high-performance data servers. However, there are still some technical limitations.

First, most of the traditional air-cooling technology uses room temperature cooling for heat dissipation. It firstly cools the indoor air and then cool chips by low-temperature air as a medium. However, this process increases the thermal resistance of heat transfer. Technically, it suffers from issues such as significant cold capacity loss, low heat-dissipation efficiency, and low energy-saving efficiency and other shortcomings. Gradually, it is becoming less suitable for the heat-dissipation needs of high-performance data servers.

Moreover, the traditional liquid cooling technology uses water as the coolant, and thus reduces the operation cost and maintenance difficulty to a certain extent, and improves the heat-dissipation efficiency compared with air cooling technology. However, the heat-dissipation efficiency is still low, the heat transportation is not efficient enough, the ultimate heat dissipation capacity is poor, the power consumption is high, and there are still deficiencies in the aspects of energy saving and improving the heat-dissipation efficiency.

In addition, the traditional microcircuit cooling platform is mainly based on the flow of cooling medium in the pipeline, and then heat exchange with the chip through the cold-plate. However, no matter whether the pipeline is flat tube or round tube, they all have problems such as large contact angle of between the cooling medium and the heat-exchange material of the chip, poor wetting performance, and flow dead zone, which affect the heat exchange performance to a certain extent, and make it impossible to exchange heat adequately.

SUMMARY

An objective of the disclosure is to provide an efficient thermal control system for a microcircuit based on liquid metal coolant, so as to solve the above problems of the prior art.

To achieve the above objective, the present disclosure provides an efficient thermal control system for a microcircuit based on liquid metal coolant, including a cooling water system, a liquid metal supply system, and a cooling system.

The liquid metal supply system is used for supplying the liquid metal to the cooling system, so as to achieve heat exchange with a chip through the liquid metal, and the cooling water system is used for cooling the liquid metal.

The cooling system includes:
- a cooling capacity distribution unit, where the cooling capacity distribution unit is used for distributing the liquid metal;
- multiple cabinets, where each of the cabinets is provided with chip cooling platforms, the cooling capacity distribution unit is in communication with the chip cooling platforms through a pipe, and each of the chip cooling platforms is provided with the chip;
- a temperature measuring component, where the temperature measuring component is used for measuring temperature of the chip; and
- a control unit, where both the cooling capacity distribution unit and the temperature measuring component are electrically connected to the control unit.

In some embodiments, the liquid metal supply system includes:
- a liquid metal storage box, where the liquid metal is contained in the liquid metal storage box, and the liquid metal storage box is in communication with the chip cooling platforms through the pipe;
- an electromagnetic pump, where the electromagnetic pump is installed on the pipe between the liquid metal storage box and the chip cooling platforms; and
- a shell-and-tube heat exchanger, where the cooling water system cools the liquid metal through the shell-and-tube heat exchanger.

In some embodiments, the cooling water system includes:
a condenser, where the condenser is in communication with the shell-and-tube heat exchanger, and a throttle valve is installed at an outlet end of the condenser;
- a cooling tower, where the cooling tower is used for cooling down the condenser;
- a compressor, where the compressor is used for compressing a refrigerant and driving the refrigerant to flow sequentially through the condenser, the throttle valve and the shell-and-tube heat exchanger.

In some embodiments, the cooling capacity distribution unit includes:
- a total cooling capacity distribution unit, where an output end of the electromagnetic pump is in communication with the total cooling capacity distribution unit, and an output end of the total cooling capacity distribution unit is in communication with a cooling flow pipe; and
- a secondary cooling capacity distribution unit, where the secondary cooling capacity distribution unit includes branch pipes provided at inlets and outlets of the chip cooling platforms;
- the branch pipes at the inlets of the chip cooling platforms are in communication with an end of the cooling flow pipe, and the branch pipes at the outlets of the chip cooling platforms are in communication with a heat flow pipe, an end of the heat flow pipe is in communication with the shell-and-tube heat exchanger, each of the branch pipes at the inlets and the outlets of the chip cooling platforms is provided with a flow regulating valve, and the cooling flow pipe and the heat flow pipe are each provided with a valve.

Both the flow regulating valves and the total cooling capacity distribution unit are electrically connected to the control unit.

In some embodiments, a flowmeter is installed on each of the branch pipes at the outlets of the chip cooling platforms.

In some embodiments, each of the chip cooling platforms includes:
a housing, wherein the chip is installed on the housing, one end of a bottom surface of the housing is provided with an inlet in communication with the cooling capacity distribution unit, and another end of the bottom surface of the housing is provided with an outlet; and
a micro-fin array, wherein the micro-fin array is fixedly arranged inside the housing, and an inlet end of the outlet is higher than the micro-fin array.

In some embodiments, the liquid metal is a gallium indium tin alloy, and a ratio of Ga:In:Sn in the gallium indium tin alloy is 75:10:15.

In some embodiments, the temperature measuring component is a thermocouple thermometer.

Compared with the prior art, the present disclosure has the following effects.

In this disclosure, the liquid metal is used as the cooling medium. By means of the physical properties of liquid metal such as high thermal conductivity, it effectively reduces the thermal resistance and thermal stress during the heat transfer process, and has the features such as good heat exchange performance, rapid heat exchange, and short heat exchange time. This realizes efficient heat conduction for the chips, reduces energy loss, has a better ultimate heat dissipation capacity than water, and meets the heat dissipation requirements of large-scale data room.

Further, the liquid metal is used as an efficient cooling medium, only one vapor compression refrigeration system is required to assist in driving the refrigeration, forming a vapor compression refrigeration coupled with a liquid metal cooling circulation system. While ensuring efficient thermal control of the chips, it integrates the traditional refrigeration cycle, reduces the usage amount of liquid metal and the operating cost of the system, and minimizes energy waste.

Compared with the conventional pipes in traditional liquid heat dissipation, an appropriate number of prismatic micro-fin structures arranged in a staggered pattern are set within the internal flow channels of the housing of the chip cooling platform. These structures are used to disrupt the thermal boundary layer of the fluid, keep the liquid metal in the flow channel in a turbulent state, and enhance the heat exchange performance.

According to the principle of single system, a multi-system online platform is designed, and multiple system are combined. While ensuring efficient thermal control, with the help of temperature feedback, intelligent micro-control is carried out on a unified operation platform. It can accurately monitor and control the working states of each system, making operation and management more convenient and reducing management costs.

Due to the characteristics of the liquid metal such as high thermal conductivity and strong cold-quantity transportation capacity, the liquid metal is transported by the total cooling capacity distribution unit through multiple branch pipes, so as to achieve reasonable distribution of cooling capacity by multi-channel parallel and uniform heat transfer with chip, which shortens the chip heat dissipation time, solves the problem of the distribution of cooling capacity for heat dissipation in the actual production, and facilitates the arrangement of the actual production pipeline.

BRIEF DESCRIPTION OF THE DRAWINGS

In order to more clearly illustrate the technical solutions in the embodiments of the present disclosure or the prior art, the following will briefly introduce the drawings that are used in the embodiments. Apparently, the following description of the drawings is only some of the embodiments of the present disclosure, and for one of ordinary skill in the art, other drawings may be obtained based on the drawings without creative effort.

DETAILED DESCRIPTION OF THE EMBODIMENTS

It is noted that embodiments and features in embodiments of the present disclosure may be combined with each other without conflict. The described embodiments are only a part of the embodiments of the present disclosure, and not all of the embodiments. All other embodiments obtained by one of ordinary skill in the art without creative effort are covered by the present disclosure. The following is a detailed description of the present disclosure with reference to the accompanying drawings and in conjunction with the embodiments.

Figure 1:
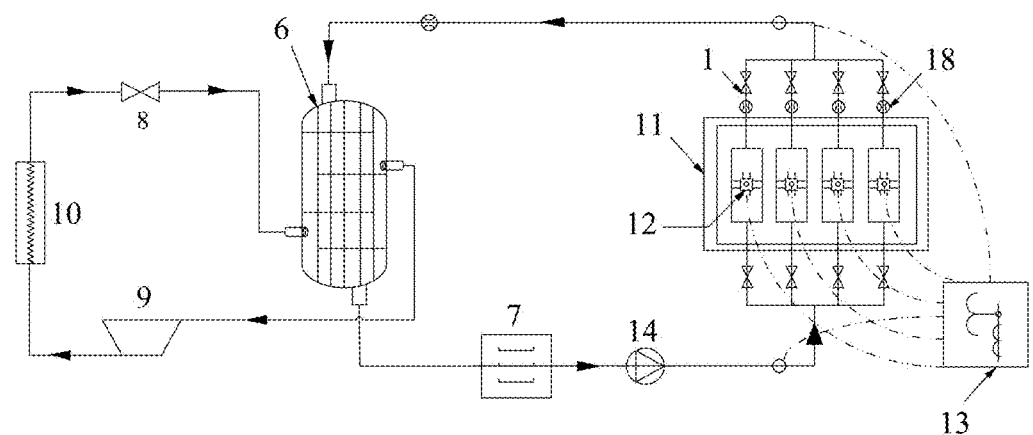
FIG. 1 shows a schematic diagram of a single system of an efficient thermal control system for a microcircuit of the present disclosure.
Figure 2:
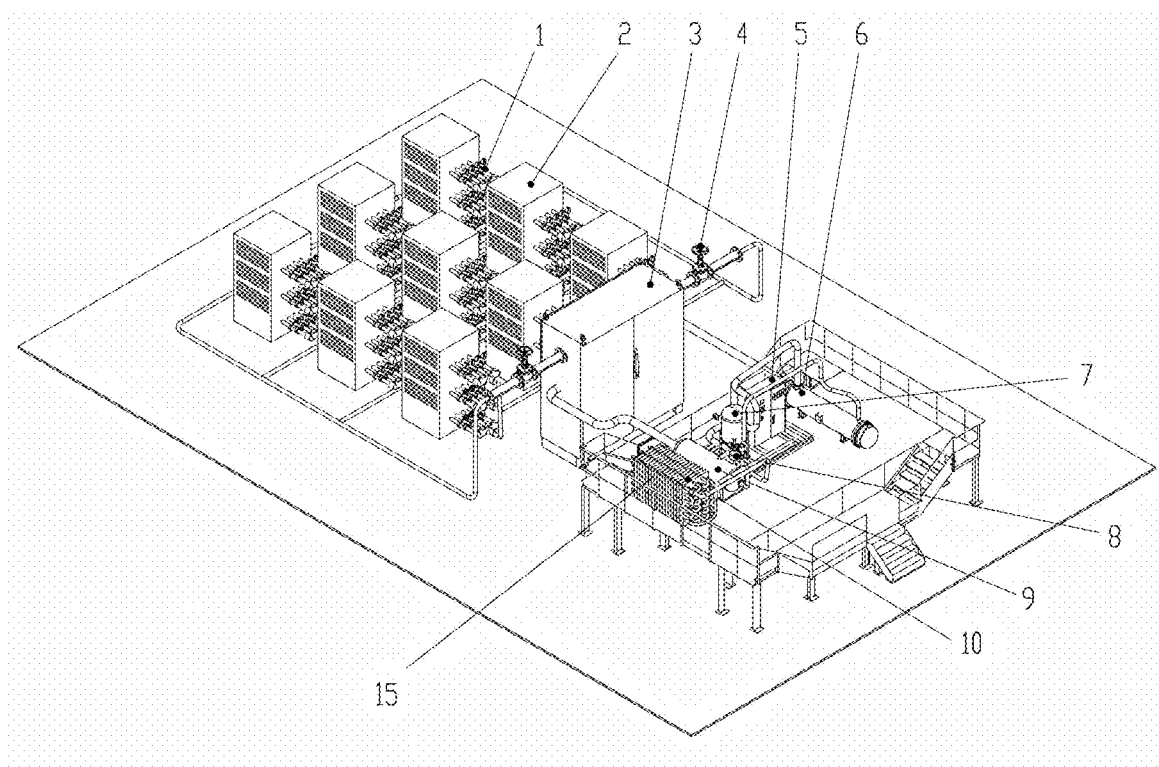
FIG. 2 shows a schematic structural diagram of a multi-unit system of the efficient thermal control system for a microcircuit of the present disclosure.
Figure 3:
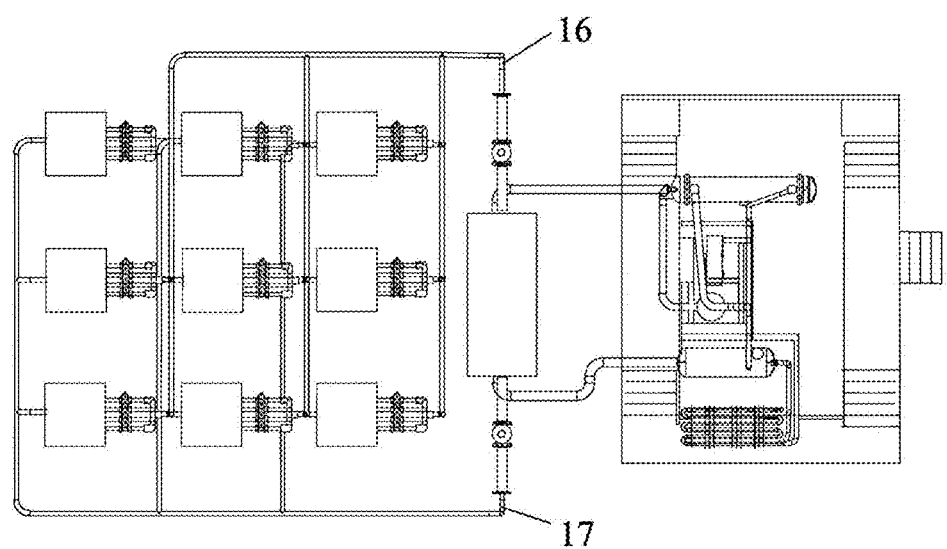
FIG. 3 shows a top view of the multi-unit system of the efficient thermal control system for a microcircuit of the present disclosure.
Figure 4:
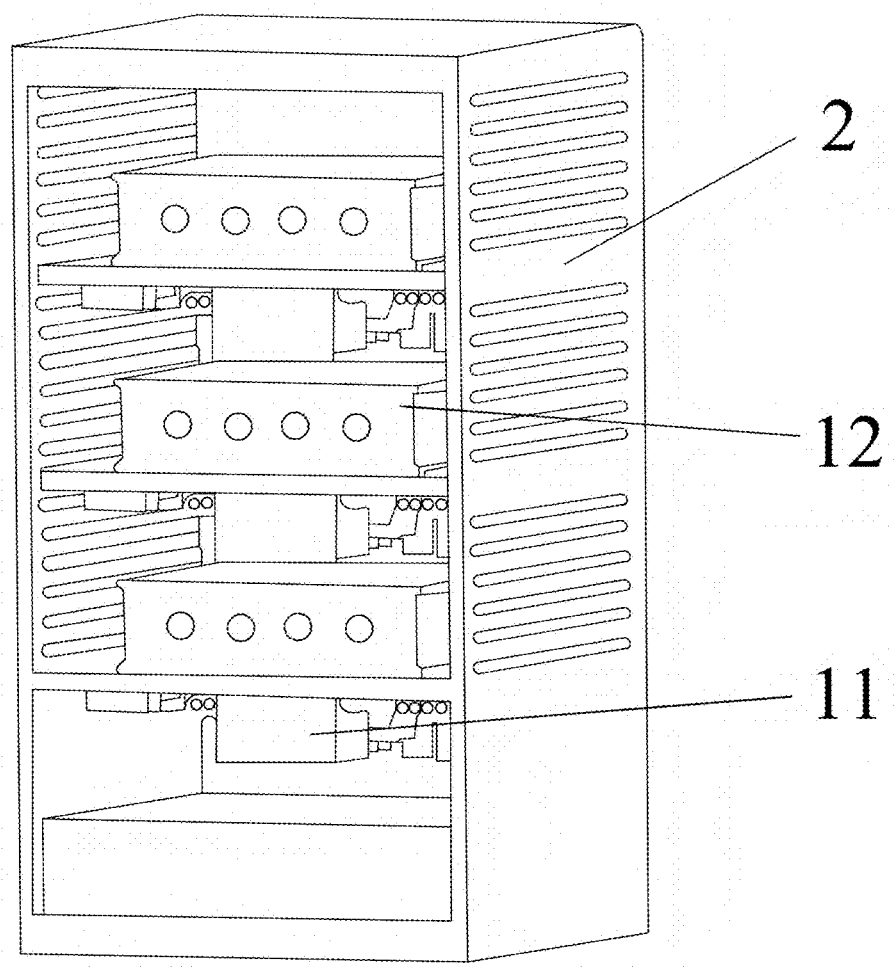
FIG. 4 shows a schematic structural diagram of a cabinet of the present disclosure.
Figure 5:
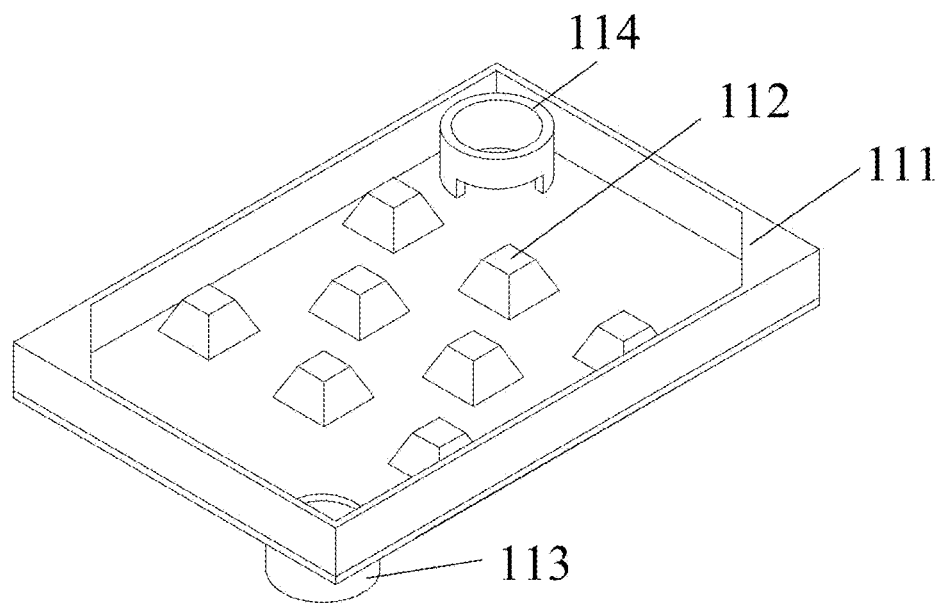
FIG. 5 shows a schematic structural diagram of a chip cooling platform of the present disclosure.
Figure 6:
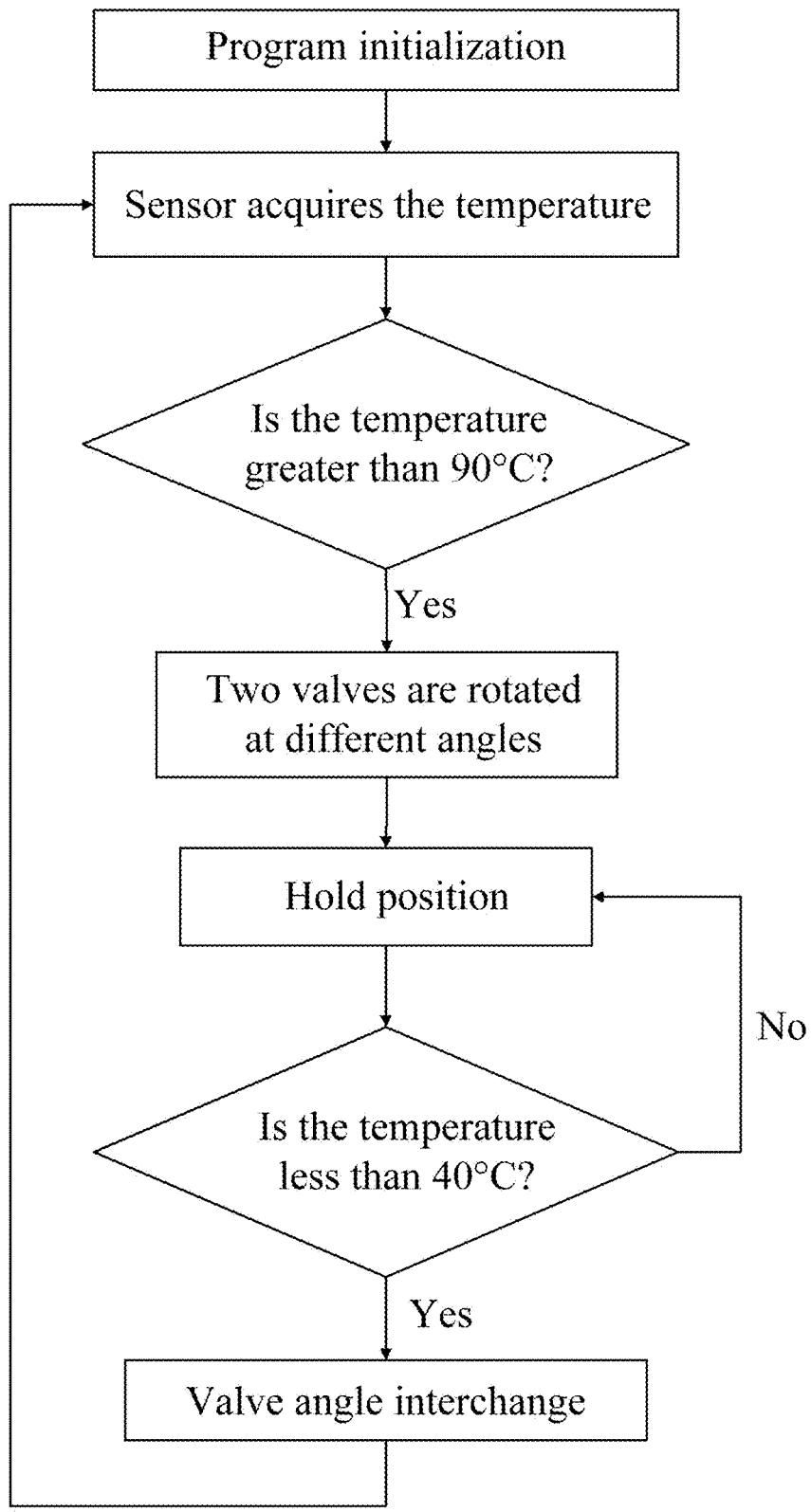
FIG. 6 shows a control flow diagram of the present disclosure.

As shown in FIG. 1 to FIG. 6, the disclosure provides an efficient thermal control system for a microcircuit based on liquid metal coolant, including a cooling water system, a liquid metal supply system and a cooling system.

The liquid metal supply system is used to supply the liquid metal to the cooling system, to achieve heat exchange with chips 12 through the liquid metal, and the cooling water system is used to cool the liquid metal.

The cooling system includes a cooling capacity distribution unit, multiple cabinets 2, a temperature measuring component and a control unit 5.

The cooling capacity distribution unit is used for distributing the liquid metal.

Each of the cabinets 2 is provided with chip cooling platforms 11, the cooling capacity distribution unit is in communication with the chip cooling platforms 11 through the pipe, and each of the chip cooling platforms 11 is provided with a chip 12.

The temperature measuring component is used for measuring temperature of the chips 12.

Both the cooling capacity distribution unit and the temperature measuring component are electrically connected to the control unit 5.

The liquid metal in the liquid metal supply system of the present disclosure is transported to a cooling capacity distribution unit, and according to the temperature of the chips 12, is distributed to the corresponding chip cooling platforms 11 on demand, so as to realize heat exchange between the liquid metal and the chips 12 and take away the heat from the chips 12. The hot liquid metal may be circulated for use after being cooled by the cooling water system.

The present disclosure utilizes the physical properties of high thermal conductivity and low viscosity of the liquid metal to realize highly efficient thermal conductivity of the chips 12, reduce energy loss, and meet the heat dissipation requirements of large-scale data room due to superior ultimate heat dissipation capacity.

Further, the liquid metal supply system includes a liquid metal storage box 7, an electromagnetic pump 14 and a shell-and-tube heat exchanger 6.

The liquid metal is contained in the liquid metal storage box 7, and the liquid metal storage box 7 is in communication with the chip cooling platforms 11 through the pipe.

The electromagnetic pump 14 is installed on the pipe between the liquid metal storage box 7 and the chip cooling platforms 11.

The cooling water system cools the liquid metal through the shell-and-tube heat exchanger 6.

The liquid metal is stored in the liquid metal storage box 7, and the electromagnetic pump 14 pumps the liquid metal to the chip cooling platforms 11 to realize heat exchange with the chips 12, and the hot liquid metal flows through the shell-and-tube heat exchanger 6 to be cooled and then flows back to the liquid metal storage box 7 to realize circulation.

Further, the cooling water system includes a condenser 10, a cooling tower 15 and a compressor 9.

The condenser 10 is in communication with the shell-and-tube heat exchanger 6, and a throttle valve 8 is installed at an outlet end of the condenser 10.

The cooling tower 15 is used to cool down the condenser 10.

The compressor 9 is used to compress a refrigerant and drive the refrigerant to flow sequentially through the condenser 10, the throttle valve 8 and the shell-and-tube heat exchanger 6.

After the refrigerant is compressed by the compressor 9, the refrigerant is driven to flow through the condenser 10, the throttle valve 8, and the shell-and-tube heat exchanger 6 in turn. The refrigerant dissipates heat through the condenser 10, expands after pressure reduction through the throttle valves 8, absorbs heat and evaporates through the shell-and-tube heat exchanger 6, and then returns to the compressor 9, so as to realize the refrigeration cycle and realize the cooling of the liquid metal flowing through the shell-and-tube heat exchanger 6.

Further, the cooling capacity distribution unit includes a total cooling capacity distribution unit 3 and a secondary cooling capacity distribution unit.

An output end of the electromagnetic pump 14 is in communication with the total cooling capacity distribution unit 3, and an output end of the total cooling capacity distribution unit 3 is in communication with a cooling flow pipe 16.

The secondary cooling capacity distribution unit includes the branch pipes respectively provided at the inlets 113 and the outlets 114 of the chip cooling platforms 11. The branch pipes at the inlets of the chip cooling platforms 11 are in communication with an end of the cooling flow pipe 16, and the branch pipes at the outlets 114 of the chip cooling platforms 11 are in communication with a heat flow pipe 17. An end of the heat flow pipe 17 is in communication with the shell-and-tube heat exchanger 6, and the cooling flow pipe 16 and the heat flow pipe 17 are each provided with a valve 4.

Both the flow regulating valves 1 and the total cooling capacity distribution unit 3 are electrically connected to the control unit 5.

Cooled liquid metal outputs from the total cooling capacity distribution unit 3, and flows into the cooling flow pipe 16. According to the pre-designed pipeline connection scheme, multiple branch pipes are laid on the ground, and the second cooling capacity distribution is completed through the branch pipes and the flow regulating valves 1 on the branch pipes before the cabinets 2, the opening degrees of the flow regulating valves 1 in front of and behind the chip cooling platform 11 are controlled by using a PLC circuit of the control unit 5, so that the liquid metal is diffused to each chip cooling platform 11 to realize the heat exchange of the chips 12 that needs to be cooled down and take away the heat of the chips 12, and the hot liquid metal is collected through the heat flow pipe 17 and flows back to the liquid metal storage box 7 to start a new round of circulation.

Further, a flowmeter 18 is installed on each of the branch pipes at the outlets 114 of the chip cooling platforms 11.

Further, each of the chip cooling platforms 11 includes a housing 111 and a micro-fin array 112.

The chip 12 is installed on the housing 111, one end of a bottom surface of the housing 111 is provided with an inlet 113 in communication with the cooling capacity distribution unit, and another end of the bottom surface of the housing 111 is provided with an outlet 114.

The micro-fin array 112 is fixedly arranged inside the housing 111, and an inlet end of the outlet 114 is higher than the micro-fin array 112.

The micro-fin array 112 is arranged in a staggered pattern. On one hand, it increases the heat transfer area. On the other hand, it enhances the disturbance of the fluid, disrupts the thermal boundary layers, reduces the flow dead zone, and reduces the range of the local high temperature zones, and has the highest heat exchange efficiency under the comparison of various arrangements.

Further, the liquid metal is a gallium indium tin alloy, and a ratio of Ga:In:Sn in the gallium indium tin alloy is 75:10:15.

Further, the temperature measuring component is a thermocouple thermometer 13, and the thermocouple thermometer 13 is used to monitor and collect the temperature of the chips 12 in real time, and the control unit 5 controls the opening degrees of the flow regulating valves 1 to make the liquid metal flow through the heat exchanger, so as to control the temperature of the chips 12.

In the efficient thermal control system for a microcircuit based on liquid metal coolant provided in the disclosure, when the temperature measured by the thermocouple thermometer 13 is ≥90° C., the system determines that the temperature of the chip 12 is too high at this time, and then the control unit 5 places the opening degrees of two the flow regulating valves 1 in front of and behind the chip 12 at different angles, so as to cool down the chip 12; when the temperature of the chip 12 <40° C., the control unit 5 first closes the flow regulating valves 1 at the front end, the liquid metal in the heat exchanger continues to flow forward due to the electromagnetic pump 14, and the electric regulating valve at the back end are closed, once the liquid metal flows out, so as to achieve a more rational and efficient utilization of the liquid metal. When all the chips 12 of the system do not need to dissipate heat, the control unit 5 controls the electromagnetic pump 14 to turn off, and controls the electromagnetic pump 14 to open again when the temperature of the chip 12 is higher than 90° C. next time.

The present disclosure may realize distribution and control of cooling capacity by multi-line parallel, intelligent control opening or closing of the flow regulating valve 1 according to the thermocouple thermometer 13, so that the liquid metal remains in the chip cooling platform 11 to cool chips 12 while the temperature of the liquid metal is still low, and then outflows by opening the valve 4 after the temperature of the chips 12 meeting the cooling requirements. The design makes it possible to reasonably deploy the heat dissipation program for the intermittent work of different functional chips 12 during the system operation, so as to achieve sufficient heat dissipation and reduce the dissipation of cooling capacity, and achieve the effect of efficient cooling, energy saving and emission reduction.

The above are only the better specific implementations of the present disclosure, but the scope of protection of the present disclosure is not limited thereto, and any changes or substitutions that may be readily thought of by any those skilled in the art within the technical scope disclosed in the present disclosure should be covered by the scope of protection of the present disclosure. Therefore, the scope of protection of this disclosure should be based on the scope of protection of the claims.

What is claimed is:

1. An efficient thermal control system for a microcircuit based on liquid metal coolant, comprising: a cooling water system, a liquid metal supply system and a cooling system; wherein the liquid metal supply system is used for supplying liquid metal to the cooling system, so as to achieve heat exchange with a chip through the liquid metal, and the cooling water system is used for cooling the liquid metal;
wherein the cooling system comprises:
a cooling capacity distribution unit, wherein the cooling capacity distribution unit is used for distributing the liquid metal;
a plurality of cabinets, wherein each of the cabinets is provided with chip cooling platforms, the cooling capacity distribution unit is in communication with the chip cooling platforms through a pipe, and each of the chip cooling platforms is provided with the chip;
a temperature measuring component, wherein the temperature measuring component is used for measuring temperature of the chip; and
a control unit, wherein both the cooling capacity distribution unit and the temperature measuring component are electrically connected to the control unit;
wherein each of the chip cooling platforms comprises:
a housing, wherein the chip is installed on the housing, one end of a bottom surface of the housing is provided with an inlet in communication with the cooling capacity distribution unit, and another end of the bottom surface of the housing is provided with an outlet; and
a micro-fin array, wherein the micro-fin array is fixedly arranged inside the housing, and an inlet end of the outlet is higher than the micro-fin array;
wherein each of branch pipes at inlets and outlets of the chip cooling platforms is provided with a flow regulating valve; and
wherein when the chip ≥90° C., the control unit sets opening degrees of two flow regulating valves in front of and behind the chip at different angles, so as to cool down the chip; when the chip <40° C., the control unit first closes the flow regulating valve at a front end, and closes the flow regulating valve at a back end after the liquid metal flows out.

2. The efficient thermal control system for a microcircuit based on liquid metal coolant according to claim 1, wherein the liquid metal supply system comprises:
a liquid metal storage box, wherein the liquid metal is contained in the liquid metal storage box, and the liquid metal storage box is in communication with the chip cooling platforms through the pipe;
an electromagnetic pump, wherein the electromagnetic pump is installed on the pipe between the liquid metal storage box and the chip cooling platforms; and
a shell-and-tube heat exchanger, wherein the cooling water system cools the liquid metal through the shell-and-tube heat exchanger.

3. The efficient thermal control system for a microcircuit based on liquid metal coolant according to claim 2, wherein the cooling water system comprises:
a condenser, wherein the condenser is in communication with the shell-and-tube heat exchanger, and a throttle valve is installed at an outlet end of the condenser;
a cooling tower, wherein the cooling tower is used for cooling the condenser; and
a compressor, wherein the compressor is used for compressing a refrigerant and driving the refrigerant to flow sequentially through the condenser, the throttle valve and the shell-and-tube heat exchanger.

4. The efficient thermal control system for a microcircuit based on liquid metal coolant according to claim 2, wherein the cooling capacity distribution unit comprises:
a total cooling capacity distribution unit, wherein an output end of the electromagnetic pump is in communication with the total cooling capacity distribution unit, and an output end of the total cooling capacity distribution unit is in communication with a cooling flow pipe; and
a secondary cooling capacity distribution unit, wherein the secondary cooling capacity distribution unit comprises the branch pipes provided at the inlets and the outlets of the chip cooling platforms; the branch pipes at the inlets of the chip cooling platforms are in communication with an end of the cooling flow pipe, and the branch pipes at the outlets of the chip cooling platforms are in communication with a heat flow pipe, an end of the heat flow pipe is in communication with the shell-and-tube heat exchanger, and the cooling flow pipe and the heat flow pipe are each provided with a valve;
wherein both the flow regulating valves and the total cooling capacity distribution unit are electrically connected to the control unit.

5. The efficient thermal control system for a microcircuit based on liquid metal coolant according to claim 4, wherein a flowmeter is installed on each of the branch pipes at the outlets of the chip cooling platforms.

6. The efficient thermal control system for a microcircuit based on liquid metal coolant according to claim 1, wherein the liquid metal is a gallium indium tin alloy, and a ratio of Ga:In:Sn in the gallium indium tin alloy is 75:10:15.

7. The efficient thermal control system for a microcircuit based on liquid metal coolant according to claim 1, wherein the temperature measuring component is a thermocouple thermometer.

\* \* \* \* \*